(12) United States Patent
Choi et al.

(10) Patent No.: US 12,242,205 B2
(45) Date of Patent: Mar. 4, 2025

(54) REACTION CHAMBER WITH STOP-GAPPED VACUUM SEAL

(71) Applicant: CANON KABUSHIKI KAISHA, Tokyo (JP)

(72) Inventors: Byung-Jin Choi, Austin, TX (US); Seth J. Bamesberger, Austin, TX (US); Alex Ruiz, Spicewood, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 553 days.

(21) Appl. No.: 17/538,066

(22) Filed: Nov. 30, 2021

(65) Prior Publication Data

US 2023/0168592 A1 Jun. 1, 2023

(51) Int. Cl.
| | |
|---|---|
| G03F 7/00 | (2006.01) |
| C23C 16/44 | (2006.01) |
| F16J 15/10 | (2006.01) |
| F16J 15/447 | (2006.01) |

(52) U.S. Cl.
CPC ...... *G03F 7/70808* (2013.01); *C23C 16/4409* (2013.01); *F16J 15/104* (2013.01); *F16J 15/447* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 4,889,319 A | 12/1989 | Phillips | |
| 6,606,912 B2 | 8/2003 | Ohmi | |
| 7,462,028 B2 | 12/2008 | Cherala | |
| 8,361,546 B2 | 1/2013 | Fletcher | |
| 9,778,578 B2 | 10/2017 | Meissl | |
| 10,580,659 B2 | 3/2020 | Khusnatdinov | |
| 10,781,516 B2 | 9/2020 | Chandrasekharan | |
| 2010/0173432 A1* | 7/2010 | White | H01L 21/6719 118/712 |
| 2013/0337171 A1* | 12/2013 | Sasagawa | C23C 16/45544 118/715 |
| 2015/0004798 A1* | 1/2015 | Chandrasekharan | H01L 21/67126 118/723 R |

(Continued)

FOREIGN PATENT DOCUMENTS

| | | |
|---|---|---|
| TW | 201030892 A | 8/2010 |
| TW | 201514337 A | 4/2015 |

OTHER PUBLICATIONS

Sealing Elements, Technical Handbook O-rings, ERIKS, pp. 3-8, Feb. 2010.

*Primary Examiner* — Binu Thomas
(74) *Attorney, Agent, or Firm* — Canon U.S.A., Inc. IP Division

(57) ABSTRACT

Some devices and systems comprise one or more walls of a reaction chamber; an adjustable gap in the one or more walls, wherein the adjustable gap is formed between a first gap surface and a second gap surface facing the first gap surface, and wherein a distance between the first gap surface and the second gap surface is adjustable; a plurality of stops, wherein each stop of the plurality of stops is positioned on either the first gap surface or the second gap surface, wherein the plurality of stops ensure a minimum distance of the adjustable gap, wherein a total length of the plurality of stops is less than 1% of a length of the first gap surface; and one or more vacuum ports in the first gap surface or the second gap surface.

11 Claims, 13 Drawing Sheets

(56) References Cited

U.S. PATENT DOCUMENTS

2015/0131072 A1\* 5/2015 Meissl ................ G03F 7/70708
  355/73
2020/0333702 A1 10/2020 Watani \* cited by examiner

REACTION CHAMBER WITH STOP-GAPPED VACUUM SEAL

BACKGROUND

Technical Field: This application generally concerns a reaction chamber that may be used in combination with imprint lithography and inkjet-based adaptive planarization.

Background: Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

Some nano-fabrication techniques are commonly referred to as nanoimprint lithography. Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, and the like.

Some nanoimprint lithography techniques form a feature pattern in a formable material (polymerizable) layer and transfer a pattern corresponding to the feature pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer.

Additionally, planarization techniques are useful in fabricating semiconductor devices. For example, the process for creating a semiconductor device may include repeatedly adding and removing material to and from a substrate. This process can produce a layered substrate with an irregular height variation (i.e., relief pattern), and, as more layers are added, the substrate's height variation can increase. The height variation negatively affects the ability to add further layers to the layered substrate. Moreover, semiconductor substrates (e.g., silicon wafers) themselves are not always perfectly flat and may include an initial surface height variation (i.e., relief pattern). One technique to address height variations is to planarize the substrate between layering procedures. A planarization technique sometimes referred to as inkjet-based adaptive planarization (IAP) involves dispensing a variable drop pattern of polymerizable material between the substrate and a superstrate, where the drop pattern varies depending on the substrate's relief pattern (the superstrate is a featureless plate used to control the shape a top surface of the polymerizable material). A superstrate is then brought into contact with the polymerizable material, after which the material is polymerized on the substrate, and the superstrate removed.

Various lithographic patterning techniques benefit from patterning on a planar surface. In ArFi laser-based lithography, planarization improves depth of focus (DOF), critical dimension (CD), and critical dimension uniformity (CDU). In extreme ultraviolet lithography (EUV), planarization improves feature placement and DOF. In nanoimprint lithography (NIL), planarization improves feature filling and CD control after pattern transfer.

And a substrate with polymerized material can be further subjected to known procedures and processes for device (article) fabrication, including, for example, curing, baking, oxidation, layer formation, deposition, doping, planarization, etching, formable material removal, dicing, bonding, packaging, and the like. These known procedures may also be performed prior to NIL or IAP being performed on the substrate. These known procedures may be performed in a reaction chamber that is at least partially isolated from the surrounding environment.

SUMMARY

Some embodiments of a system comprise one or more walls of a reaction chamber; an adjustable gap in the one or more walls, wherein the adjustable gap is formed between a first gap surface and a second gap surface facing the first gap surface, and wherein a distance between the first gap surface and the second gap surface is adjustable; a plurality of stops, wherein each stop of the plurality of stops is positioned on either the first gap surface or the second gap surface, wherein the plurality of stops ensure a minimum distance of the adjustable gap, wherein a total length of the plurality of stops is less than 1% of a length of the first gap surface; and one or more vacuum ports in the first gap surface or the second gap surface.

Some embodiments of a system comprise a reaction chamber that includes a first enclosing member and a second enclosing member, wherein at least one of the first enclosing member and the second enclosing member is movable relative to the other; an interface gap that is formed between a first gap surface of the first enclosing member and a second gap surface of the second enclosing member, wherein the first gap surface faces the second gap surface, and wherein the first enclosing member or the second enclosing member can be moved to vary a distance of the interface gap; a plurality of stops, wherein each stop of the plurality of stops is positioned on either the first gap surface or the second gap surface, and wherein the first enclosing member and the second enclosing member do not contact each other except for the stops and portions of the first enclosing member and the second enclosing member that contact the stops; and one or more vacuum ports in the first gap surface or the second gap surface.

Some embodiments of a system comprise a reaction chamber that includes a first enclosing member and a second enclosing member, wherein the first enclosing member is movable between a position in which the first enclosing member is positioned proximal to the second enclosing member and a position in which the first enclosing member is positioned distal to the second enclosing member, wherein the first enclosing member includes a first interface surface at a periphery of the reaction chamber, wherein the second enclosing member includes a second interface surface at the periphery of the reaction chamber, and wherein the first interface surface faces the second interface surface; a plurality of stops, wherein each stop of the plurality of stops is positioned on either the first interface surface or the second interface surface, and wherein, in the position in which the first enclosing member is positioned proximal to the second enclosing member, the first enclosing member and the second enclosing member do not contact each other except for the stops and any portions of the first interface surface and the second interface surface that contact the stops, such that a gap is formed between the first interface surface and the second interface surface; and one or more vacuum ports in the first interface surface or the second interface surface.

DESCRIPTION

Figure 1:
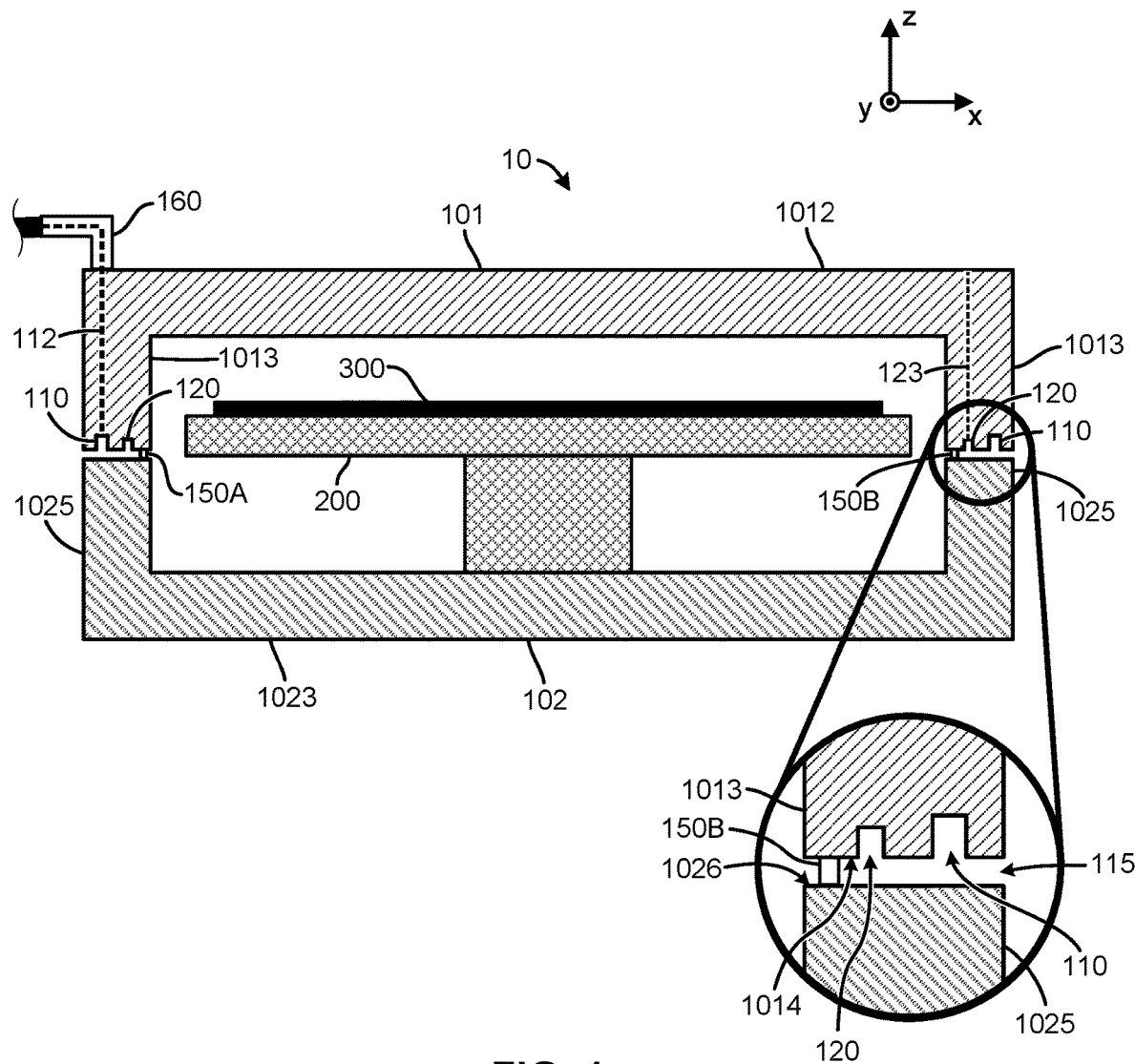
FIG. 1 illustrates an example embodiment of a reaction chamber in a closed position.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," although "or" may refer to an exclusive "or" if expressly indicated or if the context indicates that the "or" must be an exclusive "or." Furthermore, as used herein, the terms "first," "second," and so on, do not necessarily denote any ordinal, sequential, or priority relation, but are used to more clearly distinguish one member, operation, element, or set from another, unless specified otherwise.

And in the following description and in the drawings, like reference numerals designate identical or corresponding members throughout the several views.

Furthermore, in this description and the drawings, an alphabetic suffix on a reference number may be used to indicate a specific instance of the feature identified by the reference numeral. For example, a stop in a group of stops may be identified with the reference numeral 150 when a particular stop is not being distinguished. However, 150A may be used to identify a specific stop when the specific stop is being distinguished from the rest of the stops 150.

Figure 2:
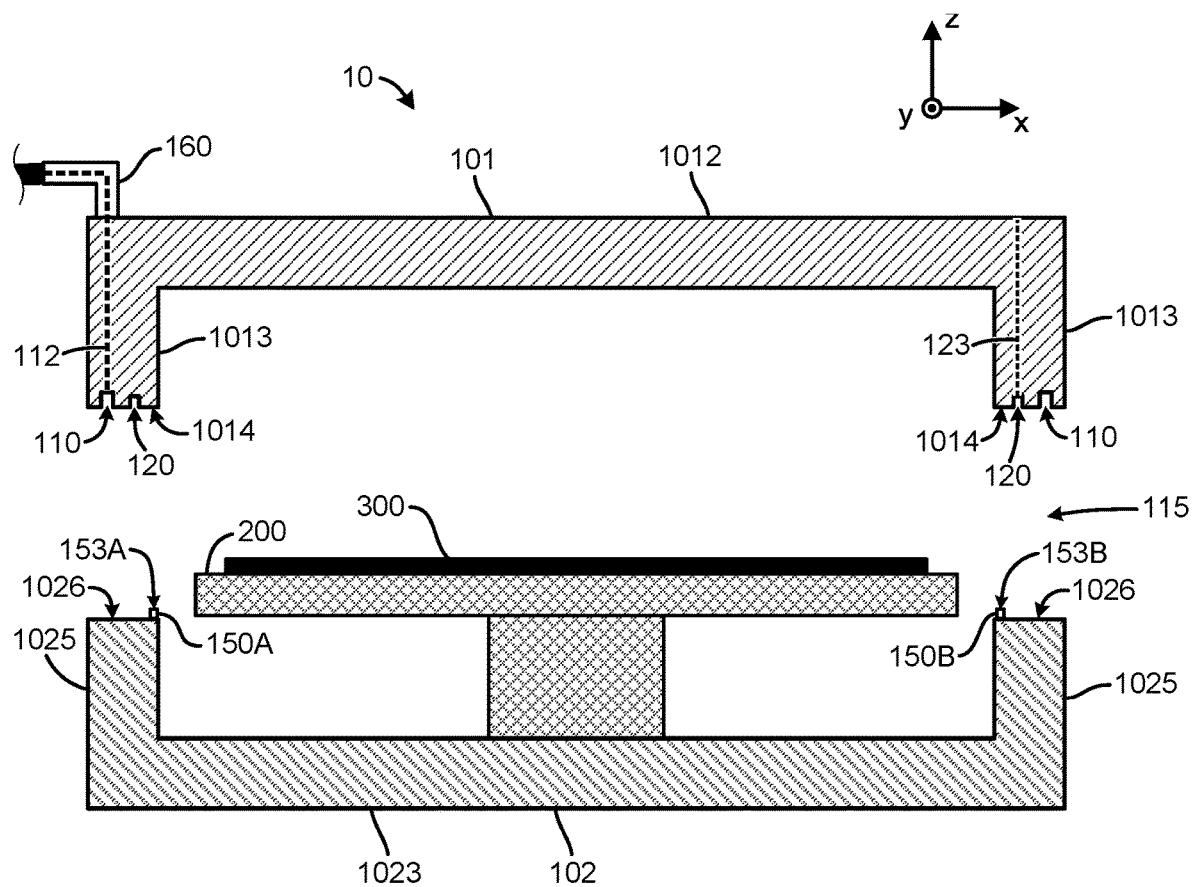
FIG. 2 illustrates an example embodiment of a reaction chamber in an open position.

FIG. 1 illustrates an example embodiment of a reaction chamber 10 in a closed position, and FIG. 2 illustrates the example embodiment of the reaction chamber 10 in the open position. The view of the reaction chamber 10 is a cutaway view. The reaction chamber 10 includes an upper enclosing member 101 (upper member 101) and a lower enclosing member 102 (lower member 102). In this embodiment, the reaction chamber 10 houses a stage 200, which is configured to support a substrate 300. The upper member 101 can be separated from the lower member 102 (e.g., by raising the upper member 101, by lowering the lower member 102), which allows the substrate 300 to be placed on the stage 200 or removed from the stage 200.

One or more processes can be performed on the substrate 300 while the substrate 300 is in the reaction chamber 10. Examples of processes include vapor-treatment processes and baking processes. Also for example, the reaction chamber 10 may include one or more of the following: a substrate seating, a thermal plate, a substrate lifting unit, one or more vents for removing process gases, and a gas flow distributor (e.g., shower head, gas distribution plate, diffusion board, discharge nozzle, perforated diffusion plate). Also, while operating, the reaction chamber 10 may be pressurized with gas or closed to the outside environment.

Figure 4:
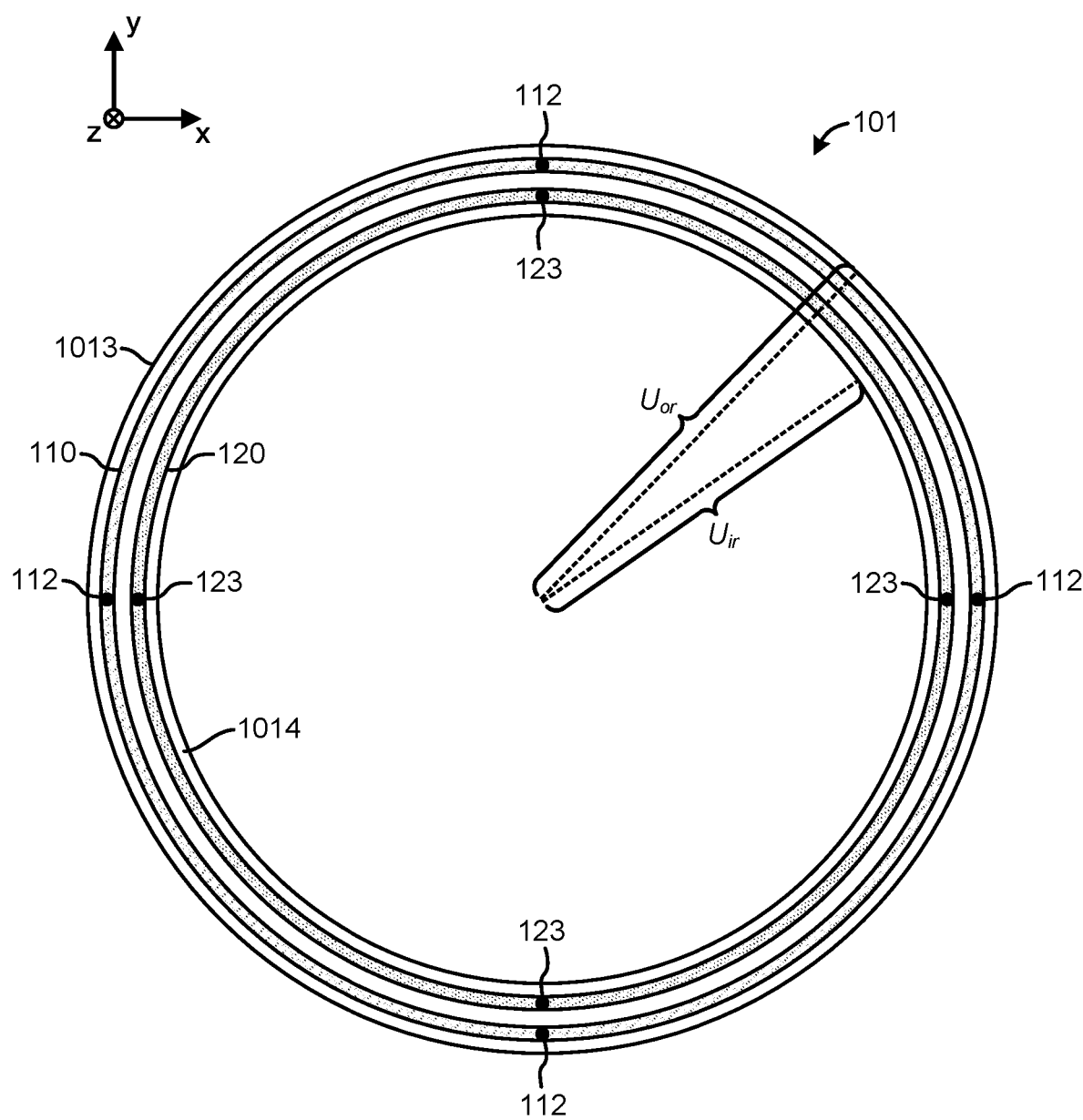
FIG. 4 illustrates an example embodiment of an upper member of a reaction chamber.

The upper member 101 includes a chamber ceiling 1012 and one or more walls 1013 that extend downward from the periphery of the chamber ceiling 1012. For example, if the shape of the upper member 101 on the xy plane is a circle or an oval (e.g., as shown in FIG. 4), then the upper member 101 may have one wall 1013 that circumscribes the outer edge of the chamber ceiling 1012. Also for example, if the shape of the upper member 101 on the xy plane is a quadrilateral, then the upper member 101 may have four walls 1013 that collectively circumscribe the outer edge of the chamber ceiling 1012. A wall 1013 of the upper member 101 may also be referred to herein as an "upper wall 1013."

Figure 5:
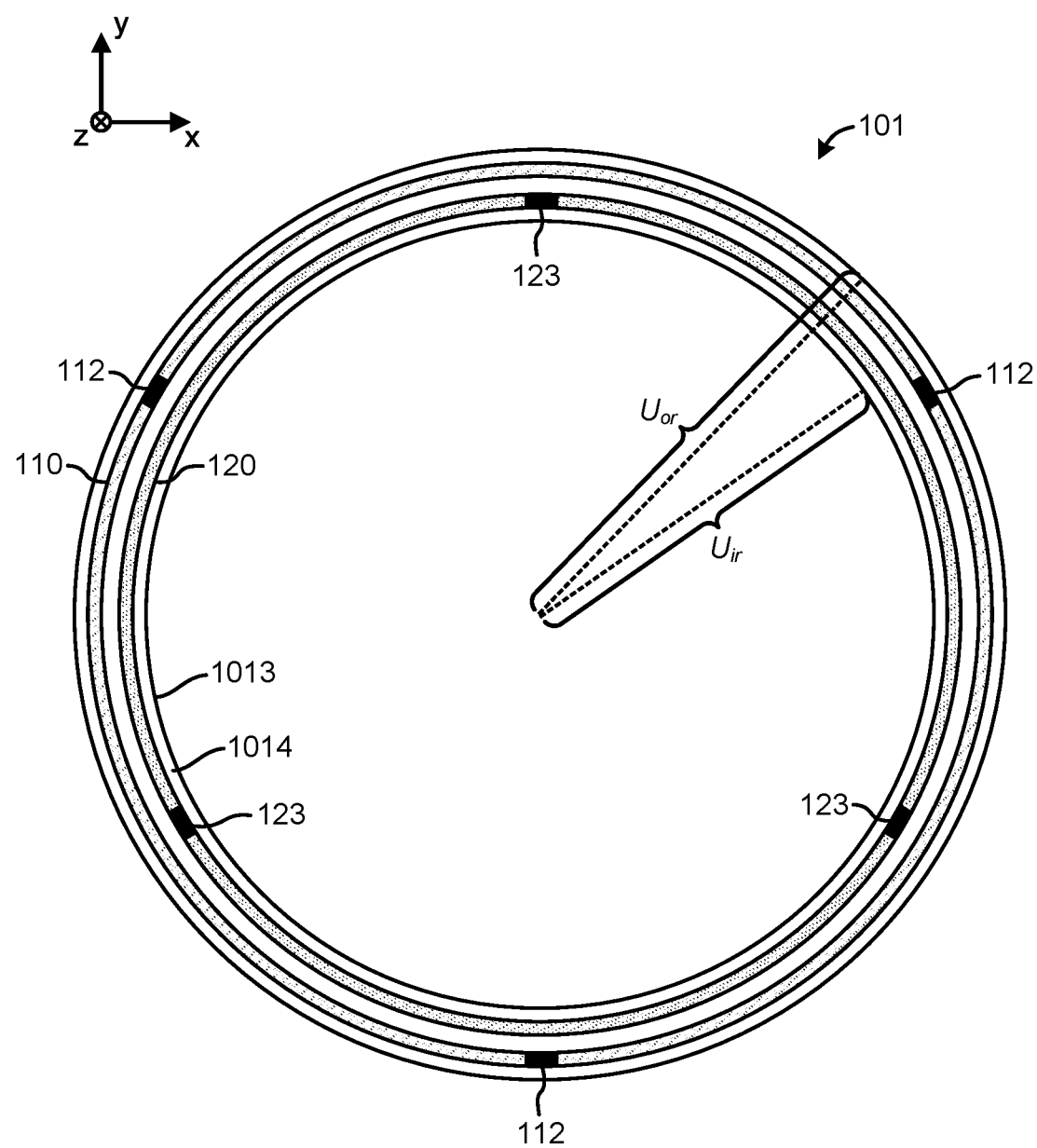
FIG. 5 illustrates an example embodiment of an upper member of a reaction chamber.

The lower member 102 includes a chamber floor 1023 and one or more walls 1025 that extend upward from the periphery of the chamber floor 1023. For example, if the shape of the lower member 102 on the xy plane is a circle or an oval (e.g., as shown in FIG. 5), then the lower member 102 may have one wall 1025 that circumscribes the outer edge of the chamber floor 1023. Also for example, if the shape of the lower member 102 on the xy plane is a quadrilateral, then the lower member 102 may have four walls 1025 that collectively circumscribe the outer edge of the chamber floor 1023. A wall 1025 of the lower member 102 may also be referred to herein as a "lower wall 1025." And, in some alternative embodiments, the lower member 102 and the upper member 101 are both polygons.

Also, in this embodiment, the lower member 102 includes stops 150 (e.g., bosses) that are positioned on the upper surfaces 1026 of the one or more lower walls 1025. When the upper member 101 and the lower member 102 are in the closed position, the upper member 101 and the lower member 102 contact each other only where contact surfaces 153 of the stops 150 contact the lower surfaces 1014 of the one or more upper walls 1013. In FIG. 2, because the upper member 101 and the lower member 102 are in the open position, the contact surfaces 153 of the stops 150 are not in contact with the lower surface 1014 of the wall 1013 of the upper member.

Thus, even when the upper member 101 and the lower member 102 are in the closed position, the lower surfaces 1014 of the one or more upper walls 1013 and the upper surfaces 1026 of the one or more lower walls 1025 define a gap 115 between them. In some embodiments, the gap 115 is positioned below a top surface of the substrate 300 while it is resting on the stage 200. Also, the lower surfaces 1014 of the one or more upper walls 1013 and the upper surfaces 1026 of the one or more lower walls 1025 may be referred herein to as "gap surfaces". And the gap 115 may be adjusted by moving the upper member 101 away from the lower member 102, for example when a substrate 300 is being placed in the reaction chamber 10 or being removed from the reaction chamber 10.

When the upper member 101 and the lower member 102 are in the closed position, the upper member 101 contacts the lower member 102 only where the stops 150 (of the lower member 102) contact the lower surfaces 1014 (of the one or more upper walls 1013 of the upper member 101). Reducing the contact area between the upper member 101 and the lower member 102 reduces the particle contamination created by separating the upper member 101 from the lower member 102 and bringing the upper member 101 and the lower member 102 into contact with each other. Furthermore, the reduced contact area can result in less particle contamination than embodiments that use an O-ring to seal the reaction chamber 10.

In this embodiment, the lower surfaces 1014 of the upper member 101 include a vacuum port, which is a vacuum groove 110 in this embodiment, and a vent, which is an intake groove 120 in this embodiment. The vacuum groove 110 is connected to one or more vacuum connectors 160 by one or more vacuum channels 112. The one or more vacuum connectors 160 can be connected to a vacuum source and/or pump to generate a vacuum in the vacuum grooves 110.

Also, the intake groove 120 is connected to one or more vent channels 123. In this embodiment, the one or more vent channels 123 open on the top of the upper member 101 to communicate with the environment outside the reaction chamber 10. However, the vent channels 123 may also connect to other supplies of gas (e.g., gas tanks, air pumps), and a pushing force may be applied (e.g., by a pressurized tank, by a fan) to the gas that flows through the vent channels 123.

Figure 3A:
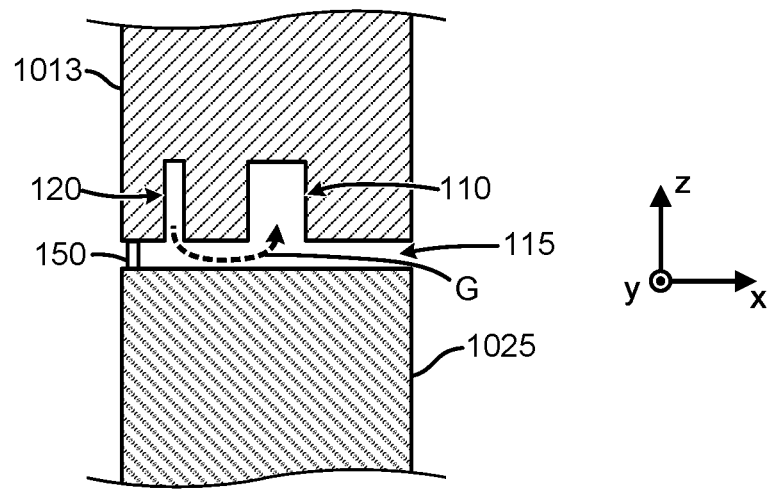
FIG. 3A illustrates the flow of gas in an example embodiment.

As the vacuum groove 110 draws gas in and directs the gas to the one or more vacuum channels 112, the one or more vent channels 123 draw gas from the environment outside the reaction chamber 10 (or from other supplies of gas) to the intake groove 120. Thus, the gas in the gap 115, and any particles that are suspended by the gas, will be drawn to the vacuum groove 110 and then to the one or more vacuum channels 112. For example, FIG. 3A illustrates the flow of gas G in an example embodiment. As shown in FIG. 3A, the gas G flows in to the gap 115 from the intake groove 120, and the gas G is sucked out of the gap 115 through the vacuum groove 110. Also, some of the gas G may flow into the reaction chamber 10. The vacuum may be active during the opening and closing of the reaction chamber 10 to suck in any particles that are created during contact and separation.

Also, the intake of gas by the one or more vent channels 123 limits or prevents the intake of gas from inside the reaction chamber 10, and the suction of gas by the vacuum groove 110 prevents external gas (gas from the external environment) from entering the reaction chamber 10. Consequently, the vacuum groove 110, the one or more vacuum channels 112, the intake groove 120, and the one or more vent channels 123 operate to seal the interior of the reaction chamber 10 from the external environment while also reducing or eliminating particle contamination that is caused by contact between the upper member 101 and the lower member 102.

Figure 3B:
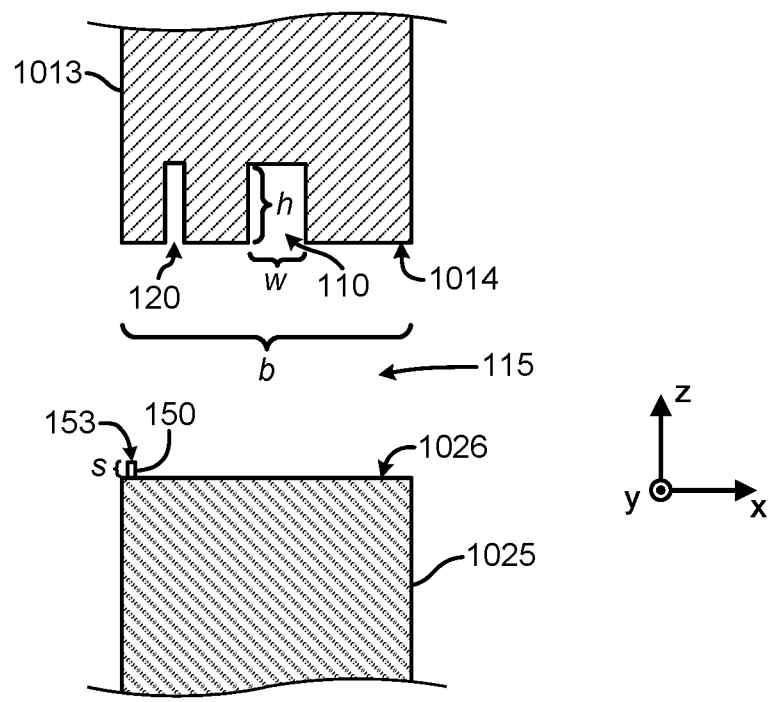
FIG. 3B illustrates an example embodiment of a reaction chamber's walls.

FIG. 3B illustrates an example embodiment of a reaction chamber's walls. Because the upper member 101 and the lower member 102 are in the open position, the contact surface 153 of the stop 150 is not in contact with the lower surface 1014 of the upper wall 1013.

In some embodiments, the height s of the stop 150 relative to the upper surface 1026 of the lower wall 1025 is between 5 and 50 μm. And, in some embodiments, the height s of the stop 150 relative to the upper surface 1026 of the lower wall 1025 is one of the following: 4 μm, 5 μm, 60 μm, 80 μm, and 100 μm.

Also, in some embodiments, the area of the cross section of the vacuum groove 110, which is h×w in FIG. 3B, is equal to or greater than the product of the height s of the stop 150 and the width b of the boundary (i.e., h×w≥s×b). Moreover, in some embodiments, the ratio of the height h of the vacuum groove 110 to the width w of the vacuum groove 110 is between 2:1 and 5:1. Also, in some embodiments, the gap surfaces (e.g., the lower surfaces 1014, the upper surfaces 1026) are defined as the areas of the walls in which the distance between the surfaces is the same as the height s of the stop 150 when the stop 150 is in contact with the opposite surface. And the width b of the boundary is equal to the depth of the gap surfaces. For example, in FIG. 3B, when the lower surface 1014 is in contact with the stop 150, the distance between the lower surface 1014 and the upper surface 1026 is the same as the height s of the stop 150, and thus the lower surface 1014 and the upper surface 1026 are gap surfaces. Also, the depths of the gap surfaces (the lower surface 1014 and the upper surface 1026) are equal to the width b of the boundary.

FIG. 4 illustrates an example embodiment of an upper member of a reaction chamber. FIG. 4 illustrates the upper member 101 from the viewing direction of the lower member (e.g., looking up along the z axis toward the upper member 101). Both the vacuum groove 110 and the intake groove 120 circumscribe the upper member 101.

In this embodiment, the upper member 101 includes four vacuum channels 112 and four vent channels 123. Also, along the circumference of the upper member 101, each vacuum channel 112 is positioned as close as possible to a corresponding vent channel 123. And the vacuum channels 112 and the vent channels 123 are evenly spaced around the circumference.

However, some embodiments include more or fewer vacuum channels 112 or include more or fewer vent channels 123. Also, the vacuum channels 112 or the vent channels 123 may be arranged differently. For example, the vacuum channels 112 may not be evenly spaced, the vent channels 123 may not be evenly spaced, and the vacuum channels 112 may be positioned farther from the vent channels 123. Also for example, FIG. 5 illustrates an example embodiment of an upper member of a reaction chamber, and FIG. 5 illustrates the upper member 101 from the viewing direction of the lower member (e.g., looking up along the z axis toward the upper member 101). The upper member 101 includes three vacuum channels 112 and three vent channels 123. Additionally, the vacuum channels 112 and the vent channels 123 are positioned such that they are as far apart as possible.

In FIGS. 4 and 5, the area $A_{ls}$ of the lower surface 1014 of the upper wall 1013 can be described by the following:

$$A_{ls} = \pi U_{or}^2 - \pi U_{ir}^2,$$

where $U_{or}$ is the outer radius of the upper wall 1013, and where $U_{ir}$ is the inner radius of the upper wall 1013.

Figure 6:
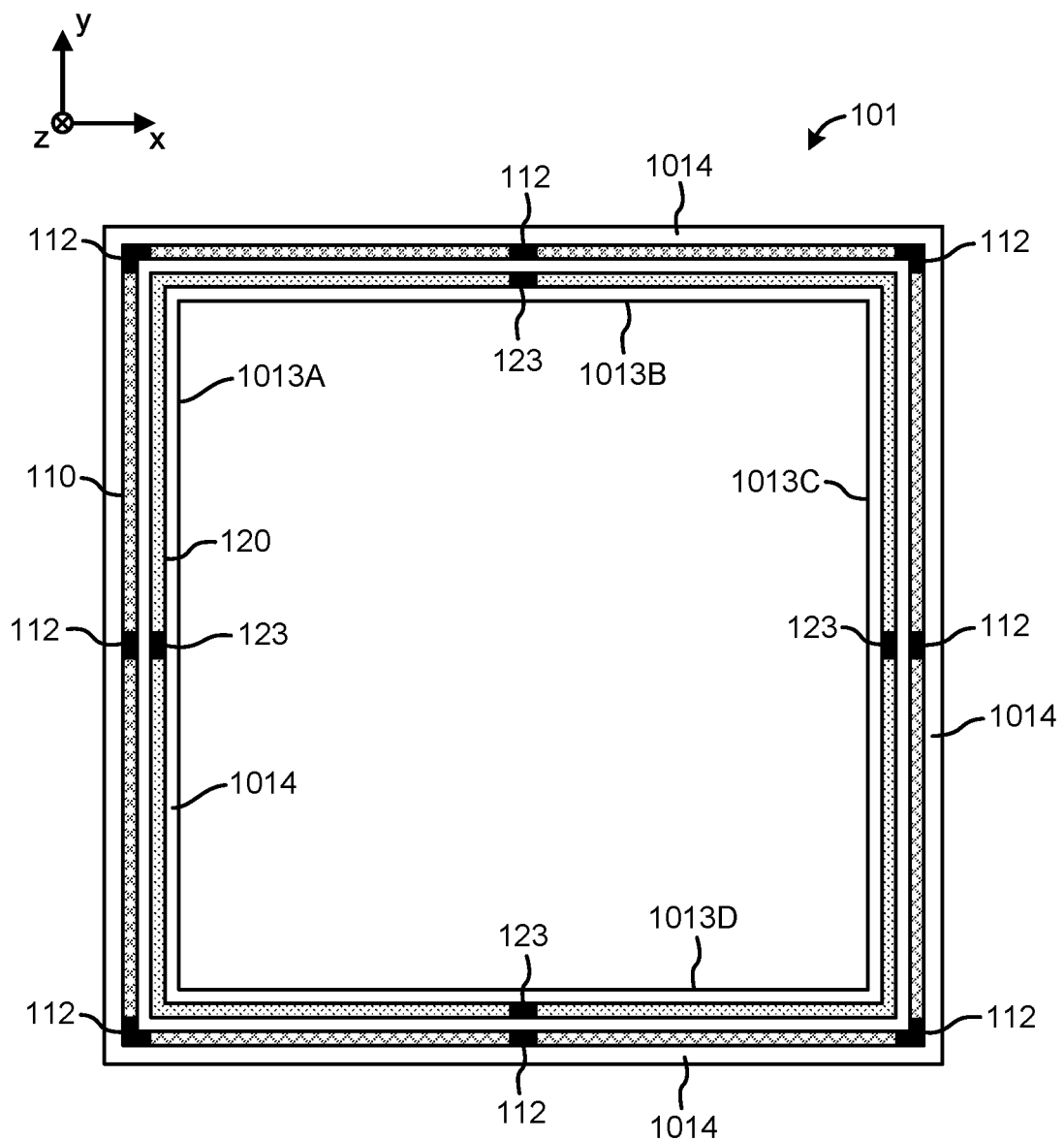
FIG. 6 illustrates an example embodiment of an upper member of a reaction chamber.

FIG. 6 illustrates another example embodiment of an upper member of a reaction chamber, and FIG. 6 illustrates the upper member 101 from the viewing direction of the lower member (e.g., looking up along the z axis toward the upper member 101). In FIG. 6, the upper member 101 includes six vacuum channels 112 and three vent channels 123. Also, in FIG. 6, the upper member 101 has a square shape, and thus includes four upper walls 1013 (walls 1013A-D).

Figure 7:
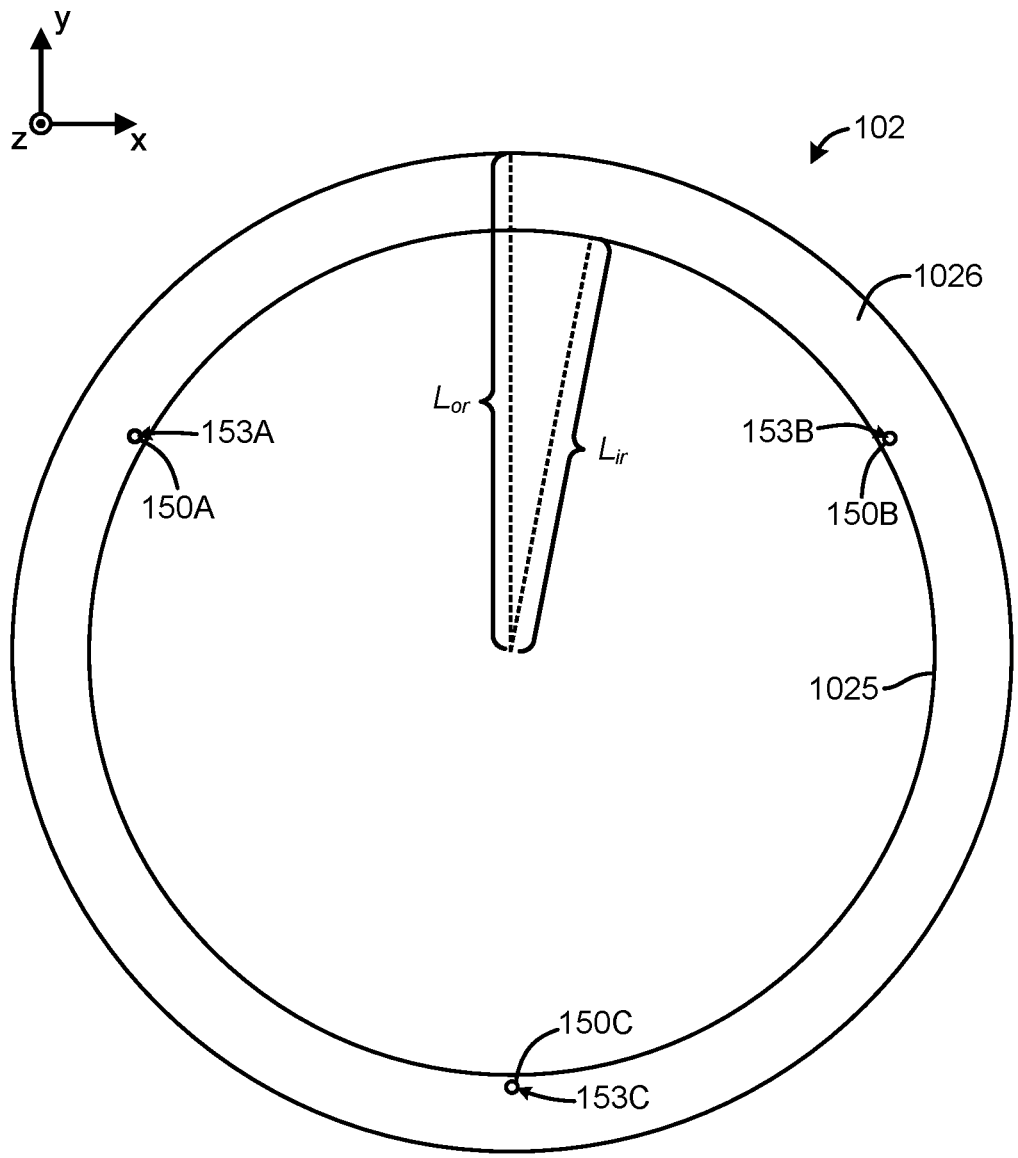
FIG. 7 illustrates an example embodiment of a lower member of a reaction chamber.

FIG. 7 illustrates an example embodiment of a lower member of a reaction chamber. FIG. 7 illustrates the lower member 102 from the viewing direction of the upper member (e.g., looking down along the z axis toward the lower member 102).

In some embodiments, the sum of the areas of the contact surfaces 153 of the stops 150 is less than 1% of the area of the upper surface 1026 of the lower wall 1025 (or, in embodiments that include multiple lower walls 102, the sum of the areas of the upper surfaces 1026 of the lower walls 1025 5). In FIG. 7, the area $A_{us}$ of the upper surface 1026 of the lower wall 1025 can be described by the following:

$$A_{us} = \pi L_{or}^2 - \pi L_{ir}^2,$$

where $L_{or}$ is the outer radius of the lower wall 1025, and where $L_{ir}$ is the inner radius of the lower wall 1025. Also, in FIG. 7, the sum of the areas $A_{sum}$ of the contact surfaces 153 of the stops 150 can be described by the following:

$$A_{sum} = A_{csa} + A_{csb} + A_{csc},$$

where $A_{csa}$ is the area of the first contact surface 153A, where $A_{csb}$ is the area of the second contact surface 153B, and where $A_{csc}$ is the area of the third contact surface 153C. Thus, in some embodiments, $A_{sum} \leq A_{us} \times 0.01$. And, in some embodiments, $A_{sum} \leq A_{us} \times 0.005$; in some embodiments, $A_{sum} \leq A_{us} \times 0.02$; in some embodiments, $A_{sum} \leq A_{us} \times 0.05$; and in some embodiments, $A_{sum} \leq A_{us} \times 0.08$.

Also, in some embodiments, the sum of the areas of the contact surfaces 153 of the stops 150 is less than 1% of the area of the lower surface 1014 of the upper wall 1013 (or, in embodiments that include multiple upper walls 1013, the sum of the areas of the lower surfaces 1014 of the upper walls 1013). Thus, in some embodiments, $A_{sum} \leq A_{ls} \times 0.01$. And, in some embodiments, $A_{sum} \leq A_{ls} \times 0.005$; in some embodiments, $A_{sum} \leq A_{ls} \times 0.02$; in some embodiments, $A_{sum} \leq A_{ls} \times 0.05$; and in some embodiments, $A_{sum} \leq A_{ls} \times 0.08$.

Furthermore, in some embodiments, the sum of the arc lengths of the stops 150 is less than 1% of the circumference of the upper wall 1013 or the lower wall 1025. And, in some embodiments, the sum of the arc lengths of the stops 150 is between 1% and 4% of the circumference of the upper wall 1013 or the lower wall 1025.

Figure 8:
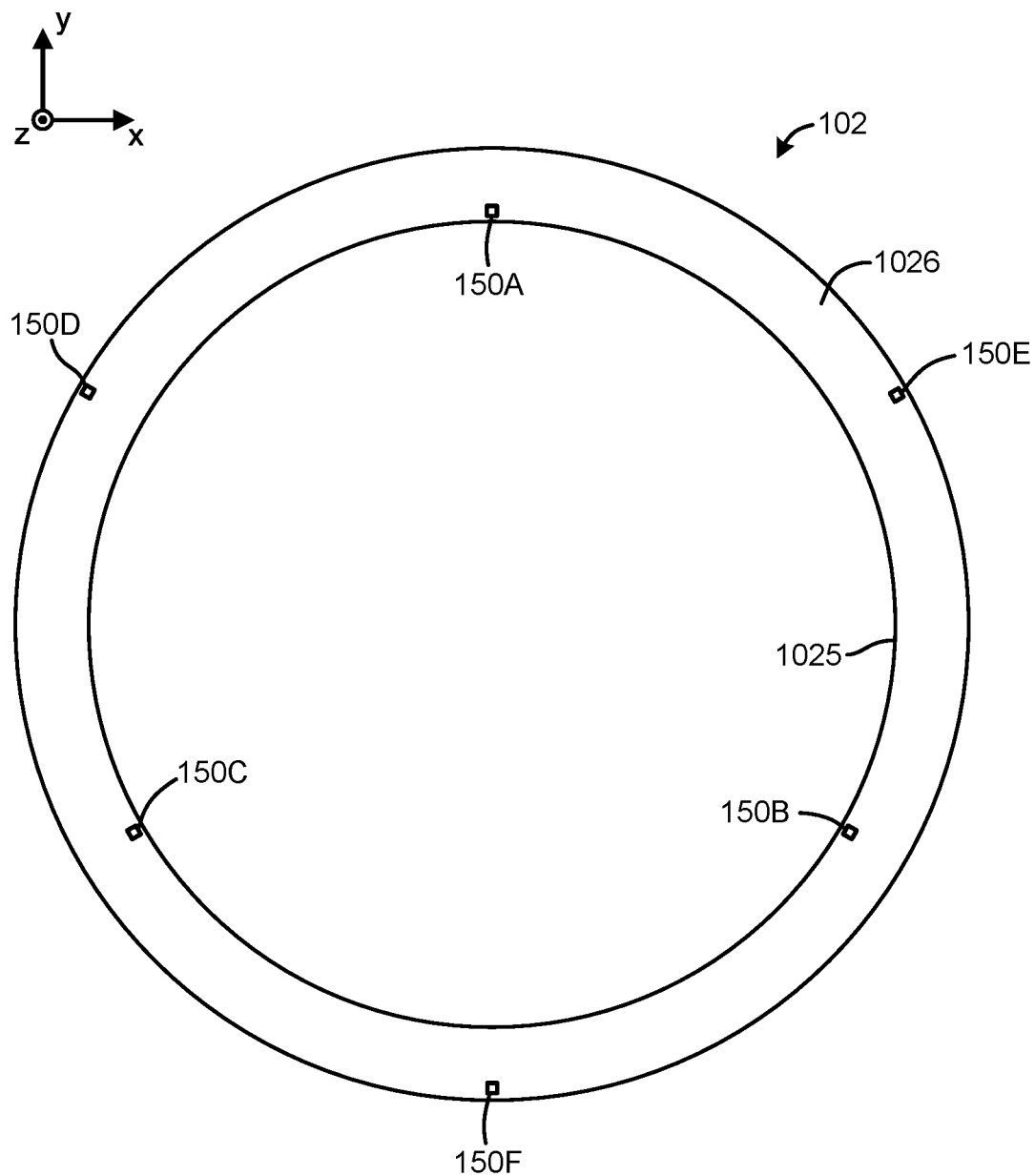
FIG. 8 illustrates an example embodiment of a lower member of a reaction chamber.

Various embodiments of the lower member 102 include different numbers of stops 150 and include different arrangements of stops 150. Also, the stops 150 may have different shapes. For example, FIG. 8 illustrates an example embodiment of a lower member of a reaction chamber. FIG. 8 illustrates the lower member 102 from the viewing direction of the upper member (e.g., looking down along the z axis toward the lower member 102). The lower member 102 includes six stops 150. Three of the stops 150A-C are positioned near the inner edge of the upper surface 1026 of the lower wall 1025, and three of the stops 150D-F are positioned near the outer edge of the upper surface 1026 of the lower wall 1025.

Also, from the perspective of a view along the z axis, the stops 150 may have various shapes. Examples of such shapes include the following: circle, oval, triangle, square, rectangle, pentagon, hexagon, annular sector, and octagon.

Figure 9:
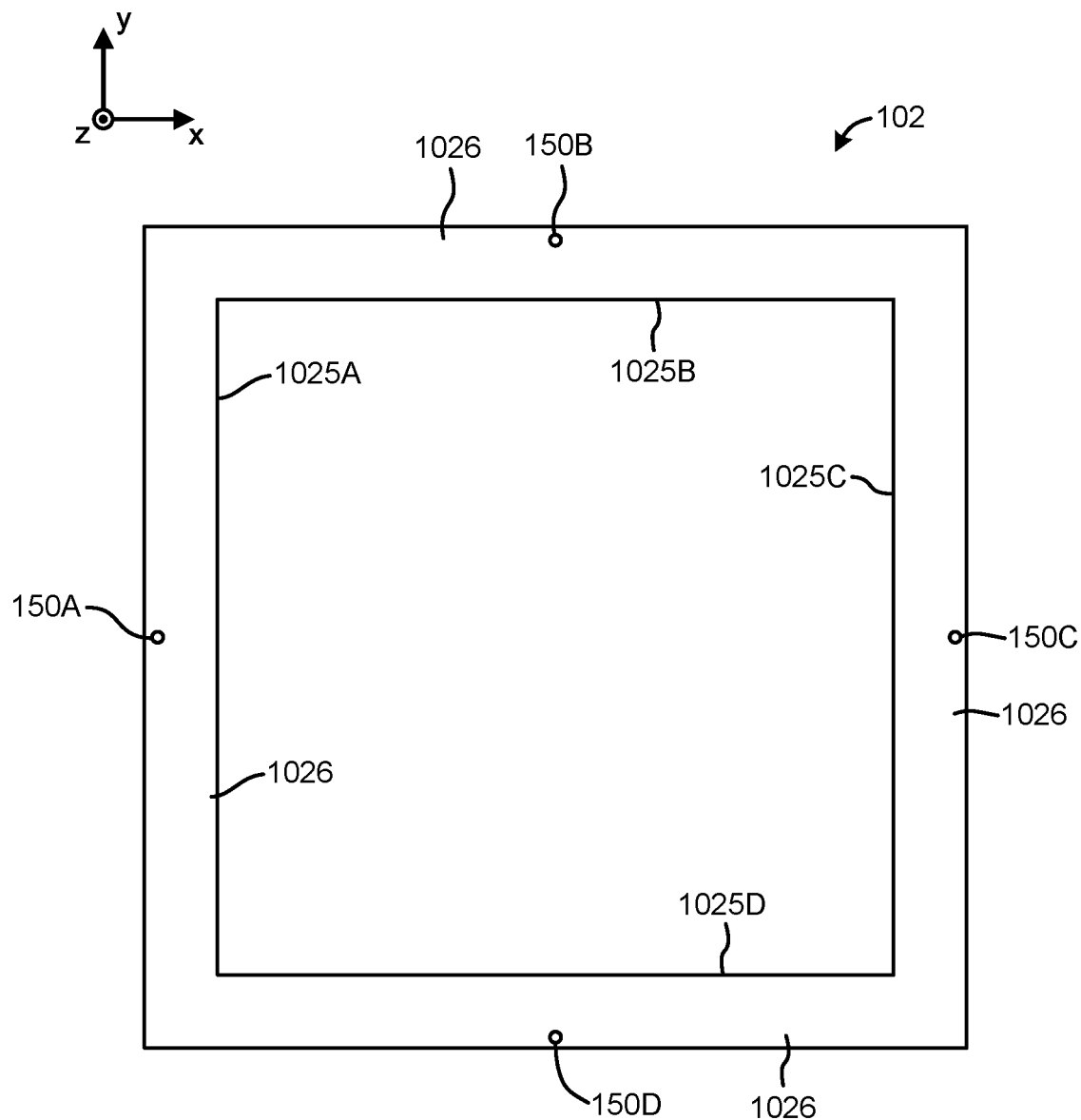
FIG. 9 illustrates an example embodiment of a lower member of a reaction chamber.

FIG. 9 also illustrates an example embodiment of a lower member of a reaction chamber. FIG. 9 illustrates the lower member 102 from the viewing direction of the upper member (e.g., looking down along the z axis toward the lower member 102). This embodiment of the lower member 102 has a square shape, and thus includes four lower walls 1025 (walls 1025A-D). The lower member 102 includes four stops 150, which are positioned near the outer edges of the upper surfaces 1026 of the lower wall 1025.

Some embodiments of the reaction chamber 10 include other arrangements of the stops 150, the vacuum groove 110, and the intake groove 120.

Figure 10A:
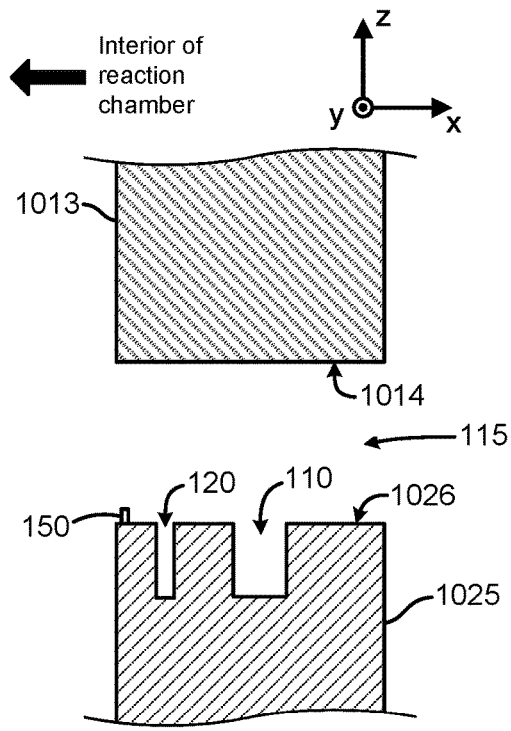
FIGS. 10A-C illustrate example embodiments of a reaction chamber's walls.
Figure 10B:
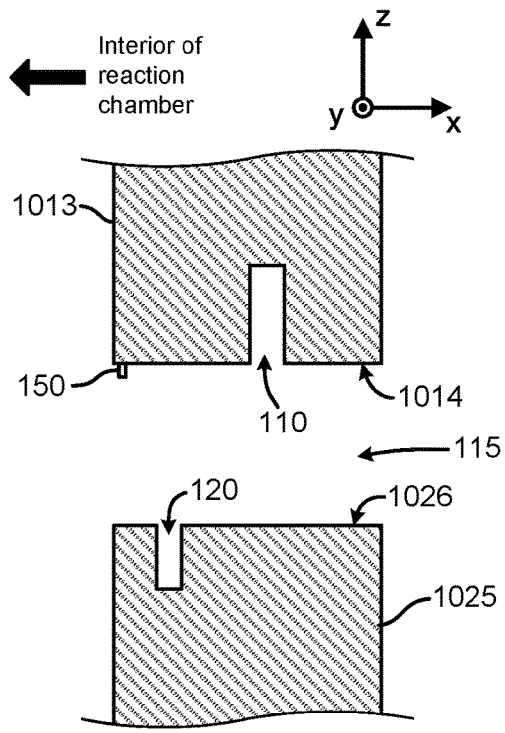
Figure 10C:
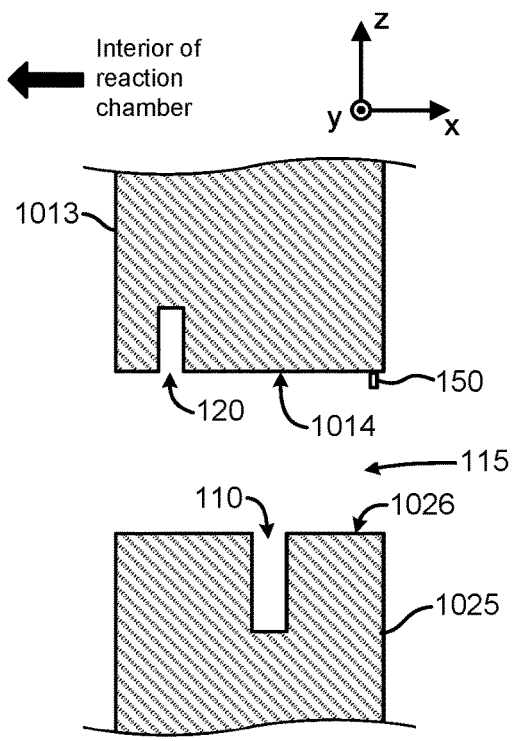

For example, FIGS. 10A-C illustrate example embodiments of a reaction chamber's walls. In FIG. 10A, the vacuum groove 110, the intake groove 120, and the stop 150 are all located in or on the upper surface 1026 of the lower wall 1025. In FIG. 10B, the stop 150 and the vacuum groove 110 are located in or on the lower surface 1014 of the upper wall 1013. Also, the intake groove 120 is located in the upper surface 1026 the lower wall 1025. In FIG. 10C, the intake groove 120 and the stop 150 are located in or on lower surface 1014 of the upper wall 1013. Also, the stop 150 is located near the outer edge of the lower surface 1014 of the upper wall 1013. And the vacuum groove 110 is located in the upper surface 1026 of the lower wall 1025.

Figure 11A:
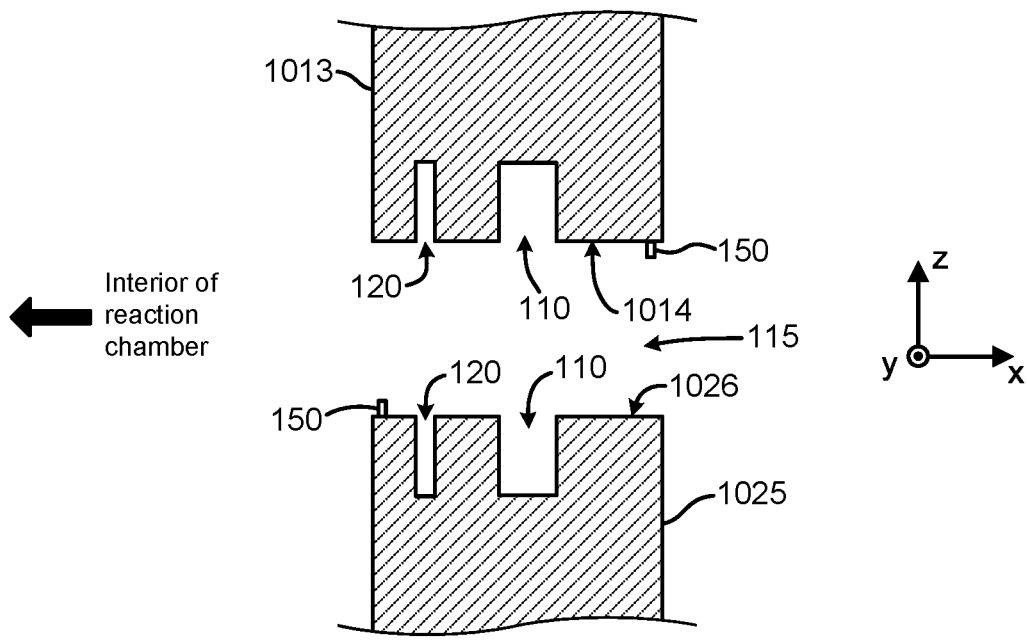
FIGS. 11A-B illustrate example embodiments of a reaction chamber's walls.
Figure 11B:
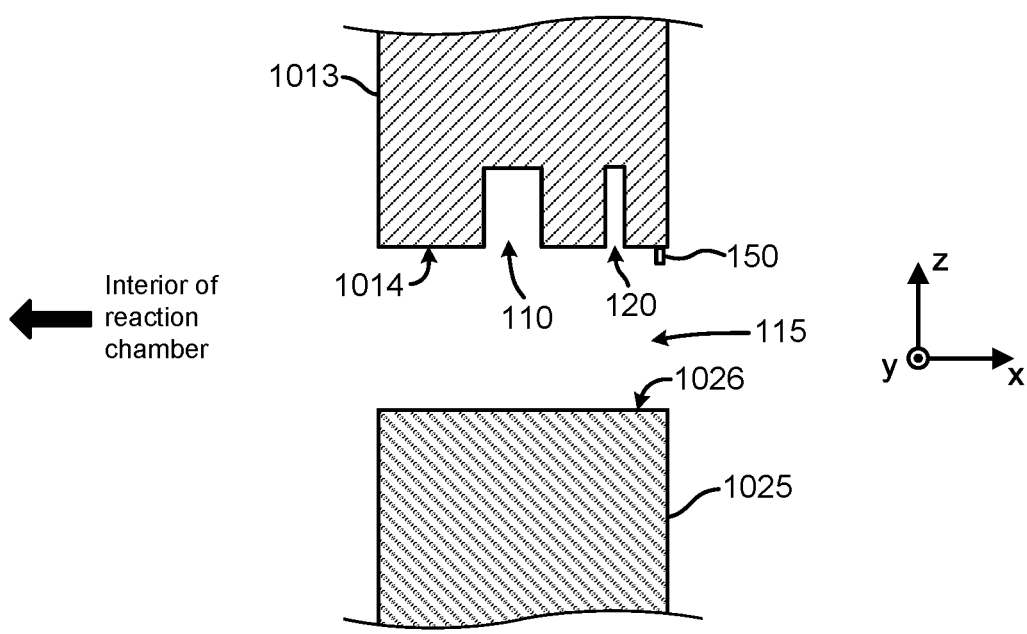

Also for example, FIGS. 11A-B illustrate example embodiments of a reaction chamber's walls. In FIG. 11A, a vacuum groove 110, an intake groove 120, and a stop 150 are all located in or on the upper surface 1026 of the lower wall 1025. Additionally, a vacuum groove 110, an intake groove 120, and a stop 150 are all located in or on the lower surface 1014 of the upper wall 1013. In FIG. 11B, a vacuum groove 110, an intake groove 120, and a stop 150 are all located in or on the lower surface 1014 of the upper wall 1013. And the vacuum groove 110 is closer than the intake groove 120 to the interior of the reaction chamber 10.

Figure 12:
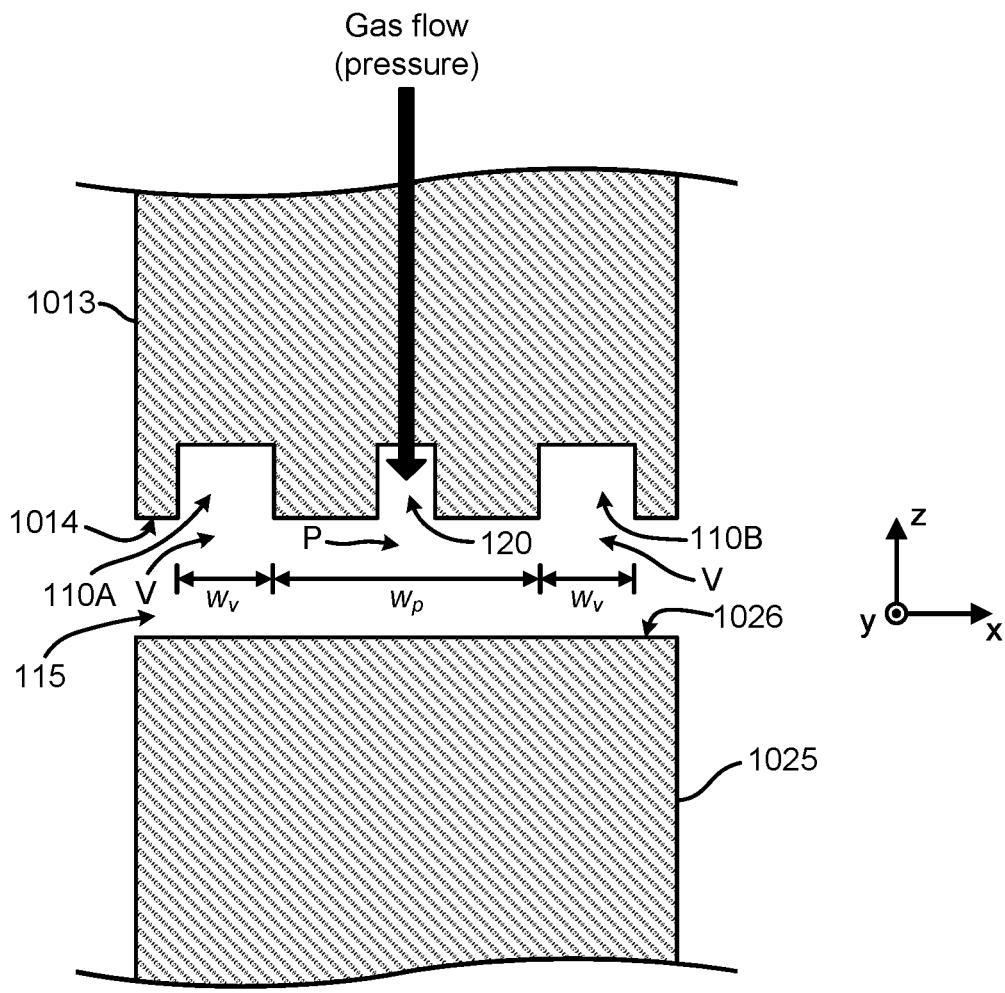
FIG. 12 illustrates an example embodiment of a reaction chamber's walls.

Furthermore, some embodiments include one or more of the following: multiple intake grooves 120 in a lower surface 1014 of an upper wall 1013, multiple vacuum grooves 110 in a lower surface 1014 of an upper wall 1013, multiple intake grooves 120 in an upper surface 1026 of a lower wall 1025, and multiple vacuum grooves 110 in an upper surface 1026 of a lower wall 1025. Also, in some embodiments, an intake groove 120 is positioned, in a radial direction, between two vacuum grooves 110 (at least some of which may be in a different wall than the intake groove 120, and at least some of which may be in the same wall as the intake groove 120), for example as shown in FIG. 12. And, in some embodiments, a vacuum groove 110 is positioned, in a radial direction, between two intake grooves 120 (at least some of which may be in a different wall than the vacuum groove 110, and at least some of which may be in the same wall as the vacuum groove 110).

Also, some embodiments of the reaction chamber 10 omit the stops 150. FIG. 12 illustrates an example embodiment of a reaction chamber's walls, and this embodiment does not include any stops. In this embodiment, the reaction chamber includes an intake groove 120 that is, in a radial direction, sandwiched between an inner vacuum groove 110A and an outer vacuum groove 110B. Although the intake groove 120, the inner vacuum groove 110A, and the outer vacuum groove 110B are located in the upper wall 1013, one or more of them may be located in the lower wall 1025. For example, in some embodiments, the intake groove 120 is located in the lower wall 1025 and the vacuum grooves 110 are located in the upper wall 1013. Also for example, in some embodiments, the intake groove 120 and one of the vacuum grooves 110 are located in the lower wall 1025, and the other vacuum groove 110 is located in the upper wall 1013. Additionally, for example, in some embodiments, the intake groove 120 and both of the vacuum grooves 110 are located in the lower wall 1025.

Pressurized gas is supplied through the intake groove 120, which creates a pressure zone P. For the purpose of keeping the surface of the substrate 300 free from particle contamination, the gas flow may be modulated when the substrate 300 is being moved near the pressure zone P. The pressure zone P prevents the upper wall 1013 from contacting the lower wall 1025, and thus performs the same function as the stops. In some embodiments, the pressure zone P maintains a gap 115 of 5 to 50 μm between the upper wall 1013 and the lower wall 1025. And, in some embodiments, the gap 115 falls within one of the following ranges: 4-6 μm, 5-10 μm, 10-20 μm, 15-40 μm, and 20-100 μm.

Also, when a vacuum is applied to each of the two vacuum grooves 110, respective vacuum zones V are created. In some embodiments, the vacuum-zone width $w_v$ is equal to, or approximately equal to, the width of the vacuum groove 110. Also, in some embodiments, the pressure-zone width $w_p$ is defined by the width of the space between the two vacuum zones V. And, in some embodiments, the ratio of a vacuum-zone width $w_v$ to the pressure-zone width $w_p$ is 1:4 to 1:2. Additionally, in some embodiments, the ratio of a vacuum-zone width $w_v$ to the pressure-zone width $w_p$ is 1:3 to 1:1.5, 1:5 to 1:3, or 1:6 to 1:2.5.

Figure 13A:
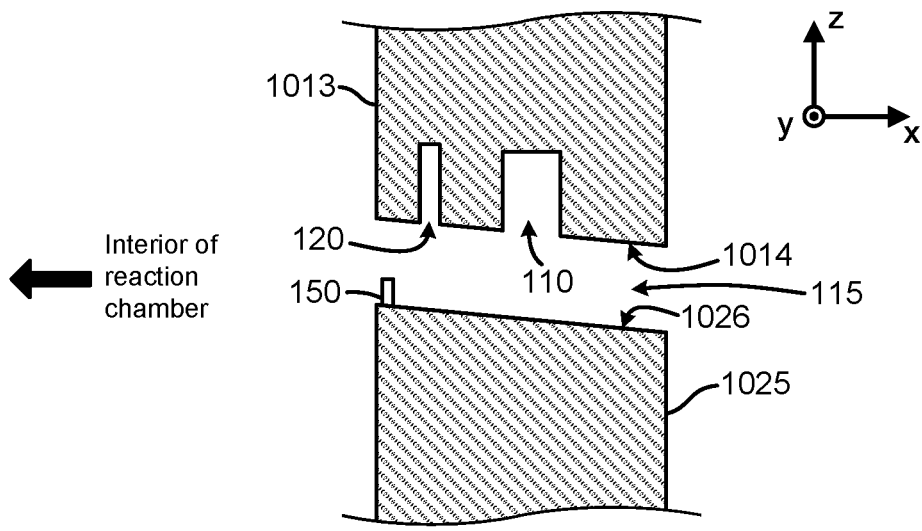
FIGS. 13A-B illustrate example embodiments of a reaction chamber's walls.
Figure 13B:
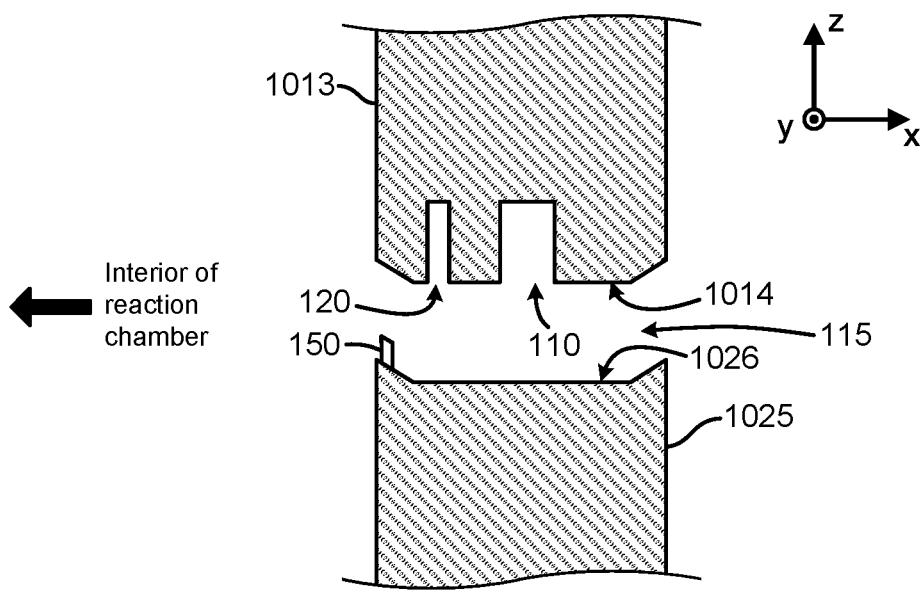

In the previous embodiments, the gap surfaces (e.g., the lower surface 1014, the upper surface 1026) are flat, horizontal surfaces. However, in some embodiments, the gap surfaces are not flat or horizontal, and the gap surfaces may include more complex surfaces (e.g., rounded, sawtooth, beveled). For example, FIGS. 13A-B illustrate example embodiments of a reaction chamber's walls. In FIG. 13A, the lower surface 1014 and the upper surface 1026 slope downward in the radial direction as the distance from the interior of the reaction chamber increases. In FIG. 13B, the middle areas, in the radial direction, of the lower surface 1014 and the upper surface 1026 are lower than the outer edges of the lower surface 1014 and the upper surface 1026. Also, in some embodiment, the lower surface 1014 and the upper surface 1026 vary in the circumferential direction.

The scope of the following claims is not limited to the above-described embodiments and includes various modifications and equivalent arrangements.

The invention claimed is:

1. A system comprising:
    one or more walls of a reaction chamber;
    an adjustable gap in the one or more walls, wherein the adjustable gap is formed between a first gap surface and a second gap surface facing the first gap surface, and wherein a distance between the first gap surface and the second gap surface is adjustable;
    a plurality of stops, wherein each stop of the plurality of stops is positioned on either the first gap surface or the second gap surface, wherein the plurality of stops ensure a minimum distance of the adjustable gap, wherein a total length of the plurality of stops is less than 1% of a length of the first gap surface; and
    one or more vacuum ports in the first gap surface or the second gap surface,
        wherein the vacuum ports, of the one or more vacuum ports, that are in the first gap surface face the second gap surface, and
        wherein the vacuum ports, of the one or more vacuum ports, that are in the second gap surface face the first gap surface.

2. The system of claim 1, wherein the length of the first gap surface is a length of an edge of the first gap surface at an intersection of the one or more walls with the first gap surface; and
    wherein a respective length of each stop of the plurality of stops is parallel to the length of the edge.

3. The system of claim 1, wherein the minimum distance is 5-50 μm.

4. The system of claim 1, wherein the adjustable gap circumscribes the reaction chamber;
    wherein the plurality of stops includes three or more stops; and
    wherein the three or more stops are spread evenly around the reaction chamber.

5. The system of claim 1, further comprising:
    one or more vents in the first gap surface or in the second gap surface.

6. The system of claim 1, further comprising:
    one or more gas vents in the first gap surface or in the second gap surface, wherein the one or more gas vents supply a gas to the adjustable gap.

7. The system of claim 1, wherein the adjustable gap is adjustable to a distance that is greater than 1 mm when workpieces are loaded into the reaction chamber.

8. A system comprising:
    a reaction chamber that includes a first enclosing member and a second enclosing member, wherein at least one of the first enclosing member and the second enclosing member is movable relative to the other;
    an interface gap that is formed between a first gap surface of the first enclosing member and a second gap surface of the second enclosing member, wherein the first gap surface faces the second gap surface, and wherein the first enclosing member or the second enclosing member is adjustable to vary a distance of the interface gap;
    a plurality of stops, wherein each stop of the plurality of stops is positioned on either the first gap surface or the second gap surface, and wherein the first enclosing member and the second enclosing member do not contact each other except for the stops and portions of the first enclosing member and the second enclosing member that contact the stops; and
    one or more vacuum ports in the first gap surface or the second gap surface,
    wherein each vacuum port of the one or more vacuum ports includes a respective groove in the first gap surface or the second gap surface, and
    wherein at least some of the plurality of stops are positioned on the first gap surface or the second gap surface such that respective distances between the at least some of the plurality of stops and an interior of the reaction chamber are less than respective distances between the vacuum ports and the interior of the reaction chamber.

9. The system of claim 8, further comprising:
    one or more vents, wherein each vent of the one or more vents is located either in the first gap surface or the second gap surface, and wherein each vent defines a channel that connects the interface gap to an exterior of the reaction chamber.

10. The system of claim 8, wherein a total area of the plurality of stops is less than 1% of a total area of the first gap surface and less than 1% of a total area of the second gap surface.

11. A system comprising:
- a reaction chamber that includes a first enclosing member and a second enclosing member, wherein at least one of the first enclosing member and the second enclosing member is movable relative to the other;
- an interface gap that is formed between a first gap surface of the first enclosing member and a second gap surface of the second enclosing member, wherein the first gap surface faces the second gap surface, and wherein the first enclosing member or the second enclosing member is adjustable to vary a distance of the interface gap;
- a plurality of stops, wherein each stop of the plurality of stops is positioned on either the first gap surface or the second gap surface, and wherein the first enclosing member and the second enclosing member do not contact each other except for the stops and portions of the first enclosing member and the second enclosing member that contact the stops; and
- one or more vacuum ports in the first gap surface or the second gap surface,
- wherein each vacuum port of the one or more vacuum ports includes a respective groove in the first gap surface or the second gap surface, and
- wherein at least some of the plurality of stops are positioned on the first gap surface or the second gap surface such that respective distances between the at least some of the plurality of stops and an interior of the reaction chamber are greater than respective distances between the vacuum ports and the interior of the reaction chamber.

* * * * *